(12) United States Patent
Kim et al.

(10) Patent No.: US 6,559,048 B1
(45) Date of Patent: May 6, 2003

(54) METHOD OF MAKING A SLOPED SIDEWALL VIA FOR INTEGRATED CIRCUIT STRUCTURE TO SUPPRESS VIA POISONING

(75) Inventors: Yong-Bae Kim, Cupertino, CA (US); Philippe Schoenborn, San Mateo, CA (US); Kai Zhang, Saratoga, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/870,851

(22) Filed: May 30, 2001

(51) Int. Cl.$^7$ .......................................... H01L 21/4763
(52) U.S. Cl. ...................... 438/637; 438/638; 438/639; 438/640; 438/666; 438/668
(58) Field of Search ................................ 438/637, 638, 639, 640, 666, 668

(56) References Cited

U.S. PATENT DOCUMENTS

| | | | |
|---|---|---|---|
| 3,012,861 A | 12/1961 | Ling | 23/223.5 |
| 3,178,392 A | 4/1965 | Kriner | 260/46.5 |
| 3,652,331 A | 3/1972 | Yamazaki | 117/201 |
| 3,832,202 A | 8/1974 | Ritchie | 106/287 |
| 3,920,865 A | 11/1975 | Läufer et al. | 427/220 |
| 4,354,897 A | * 10/1982 | Nakajima | 156/643 |
| 4,605,470 A | * 8/1986 | Gwozdz et al. | 156/643 |
| 4,705,725 A | 11/1987 | Glajch et al. | 428/405 |
| 4,771,328 A | 9/1988 | Malaviya et al. | 357/49 |
| 4,842,991 A | * 6/1989 | Brighton | 430/316 |
| 5,194,333 A | 3/1993 | Ohnaka et al. | 428/405 |
| 5,314,845 A | 5/1994 | Lee et al. | 437/238 |
| 5,364,800 A | 11/1994 | Joyner | 437/28 |
| 5,376,595 A | 12/1994 | Zupancic et al. | 501/12 |
| 5,470,801 A | 11/1995 | Kapoor et al. | 437/238 |
| 5,558,718 A | 9/1996 | Leung | 118/723 E |

(List continued on next page.)

FOREIGN PATENT DOCUMENTS

| | | | |
|---|---|---|---|
| DE | 198 04 375 A1 | 7/1999 | H01L/21/312 |
| EP | 0 706 216 A2 | 4/1996 | H01L/23/532 |
| EP | 0 949 663 A2 | 10/1999 | H01L/21/312 |
| JP | 63003437 | 1/1988 | H01L/21/90 |
| JP | 2000-267128 | 9/2000 | G02F/1/136 |
| WO | WO 99/41423 | 8/1999 | |

OTHER PUBLICATIONS

Sugahara, Satoshi, et al., "Chemical Vapor Deposition of $CF_3$–Incorporated Silica Films for Interlayer Dielectric Application", 1999 Joint International Meeting, *Electrochemical Society Meeting Abstracts*, vol. 99–2, 1999, Abstract No. 746.

(List continued on next page.)

*Primary Examiner*—John F. Niebling
*Assistant Examiner*—Lynne A. Gurley
(74) *Attorney, Agent, or Firm*—John P. Taylor

(57) ABSTRACT

Via poisoning of vias formed in low k carbon-containing silicon oxide dielectric material is suppressed by forming the via in a layer of such dielectric material with a smooth inwardly sloped sidewall. Such a sloped sidewall via can be etched in a low k dielectric layer by first forming a via resist mask over the upper surface of such a dielectric layer, then heat treating the mask sufficiently to deform the sidewall geometry of the resist mask to form a sloped sidewall on the opening or openings in the heat treated resist mask. The resulting erosion of such a resist mask, during a subsequent etch step to form the via in the low k dielectric material through such a sloped sidewall resist mask, imparts a tapered or sloped sidewall geometry to the via which is then formed in the underlying layer of low k dielectric material. In a preferred embodiment, when the via is cut through several layers of different types of dielectric material, the smoothness of the sloped sidewall of the resulting via is enhanced by adjusting the selectivity of the via etch to uniformly etch each of the layers of dielectric material at approximately the same rate.

13 Claims, 3 Drawing Sheets

U.S. PATENT DOCUMENTS

| | | |
|---|---|---|
| 5,559,367 A | 9/1996 | Cohen et al. ............... 257/77 |
| 5,580,429 A | 12/1996 | Chan et al. ............ 204/192.38 |
| 5,628,871 A | 5/1997 | Shinagawa ................ 438/514 |
| 5,675,187 A | 10/1997 | Numata et al. ............ 257/758 |
| 5,688,724 A | 11/1997 | Yoon et al. ................ 437/235 |
| 5,858,879 A | 1/1999 | Chao et al. ................ 438/725 |
| 5,864,172 A | 1/1999 | Kapoor et al. ............ 257/634 |
| 5,874,367 A | 2/1999 | Dobson ..................... 438/787 |
| 5,874,745 A | 2/1999 | Kuo ............................ 257/59 |
| 5,882,489 A | 3/1999 | Bersin et al. ......... 204/192.35 |
| 5,904,154 A | 5/1999 | Chien et al. ................ 134/1.2 |
| 5,915,198 A * | 6/1999 | Ko et al. .................... 438/640 |
| 5,915,203 A | 6/1999 | Sengupta et al. .......... 438/669 |
| 5,930,655 A | 7/1999 | Cooney, III et al. |
| 5,939,763 A | 8/1999 | Hao et al. .................. 257/411 |
| 5,989,998 A | 11/1999 | Sugahara et al. |
| 6,025,263 A | 2/2000 | Tsai et al. .................. 438/624 |
| 6,028,015 A | 2/2000 | Wang et al. ............... 438/789 |
| 6,037,248 A | 3/2000 | Ahn ........................... 438/619 |
| 6,043,145 A | 3/2000 | Suzuki et al. |
| 6,043,167 A | 3/2000 | Lee et al. ................... 438/789 |
| 6,051,073 A | 4/2000 | Chu et al. .................. 118/723 |
| 6,051,477 A | 4/2000 | Nam ........................... 438/404 |
| 6,054,379 A | 4/2000 | Yau et al. |
| 6,063,702 A | 5/2000 | Chung |
| 6,066,574 A | 5/2000 | You et al. .................. 438/781 |
| 6,114,259 A | 9/2000 | Sukharev et al. .......... 438/789 |
| 6,147,012 A | 11/2000 | Sukharev et al. .......... 438/787 |
| 6,153,524 A | 11/2000 | Henley et al. ............. 438/691 |
| 6,204,192 B1 | 3/2001 | Zhao et al. ................. 438/723 |
| 6,215,087 B1 | 4/2001 | Akahori et al. |
| 6,232,658 B1 | 5/2001 | Catabay et al. ............ 257/701 |

OTHER PUBLICATIONS

Bothra, S., et al., "Integration of 0.25 μm Three and Five Level Interconnect System for High Performance ASIC", *1997 Proceedings Fourteenth International VMIC Conference*, Santa Clara, CA, Jun. 10–12, 1997, pp. 43–48.

Dobson, C.D., et al., "Advanced $SiO_2$ Planarization Using Silane and $H_2O_2$", *Semiconductor International*, Dec. 1994, pp. 85–88.

McClatchie, S., et al., "Low Dielectric Constant Oxide Films Deposited Using CVD Techniques", *1998 Proceedings Fourth International DUMIC Conference*, Feb. 16–17, 1998, pp. 311–318.

Peters, Laura, "Low-k Dielectrics: Will Spin–On or CVD Prevail?", *Semiconductor International*, vol. 23, No. 6, Jun., 2000, pp. 108–110, 114, 116, 118, 122, and 124.

Peters, Laura, "Pursuing the Perfect Low-k Dielectric", *Semiconductor International*, vol. 21, No. 10, Sep., 1998, pp. 64–66, 68, 70, 72, and 74.

Koda, Seiichiro, et al., "A Study of Inhibition Effects for Silane Combustion by Additive Gases", *Combustion and Flame*, vol. 73, No. 2, Aug., 1988, pp. 187–194.

\* cited by examiner

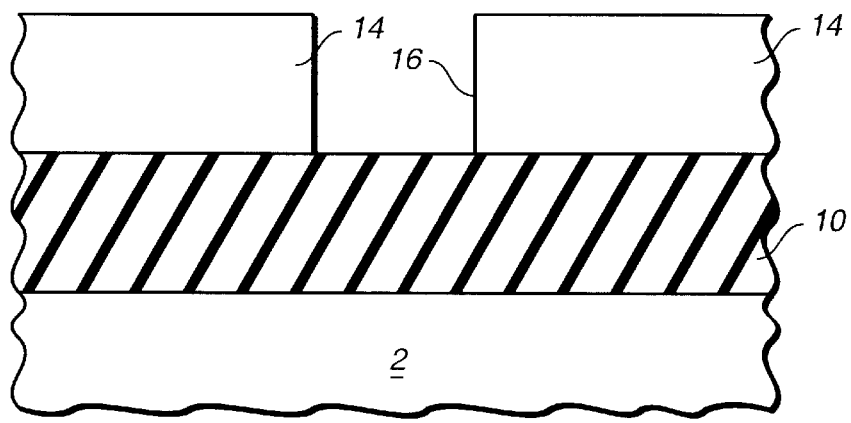
FIG._1 (PRIOR ART)
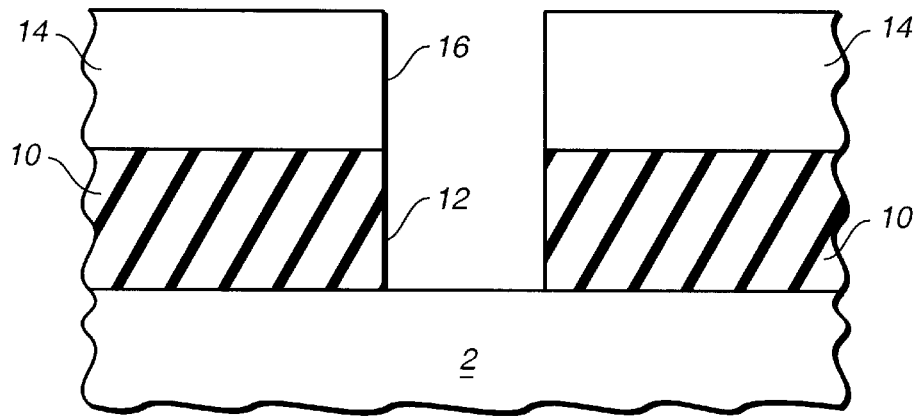
FIG._2 (PRIOR ART)
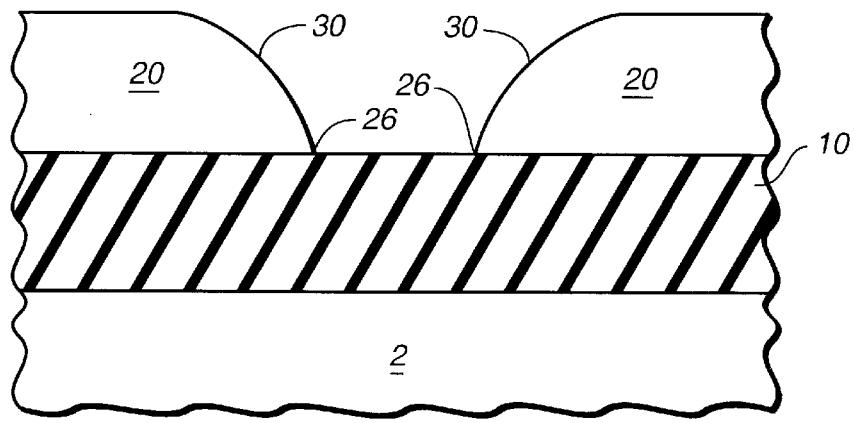
FIG._3

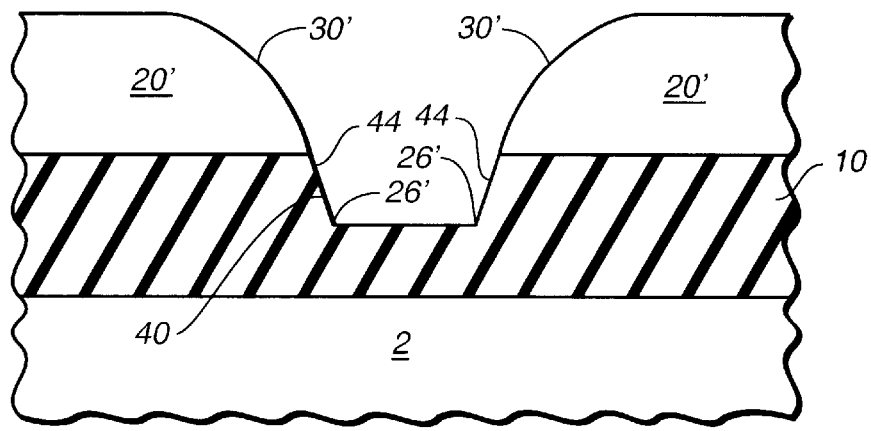
FIG._4
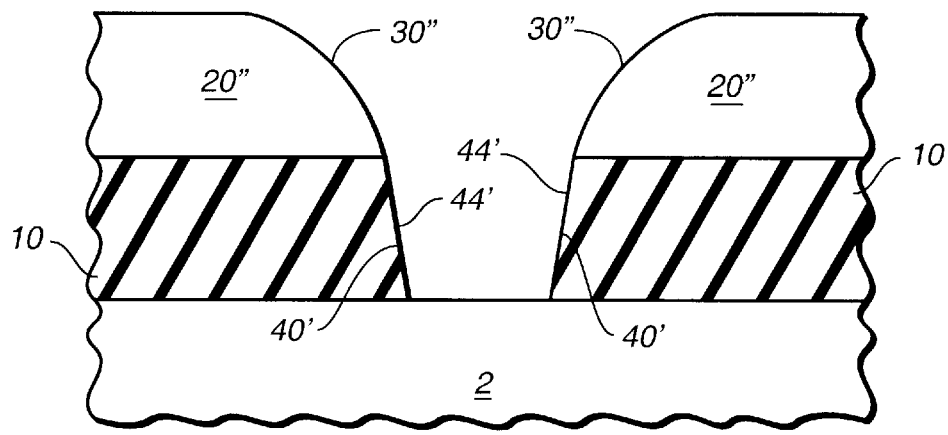
FIG._5
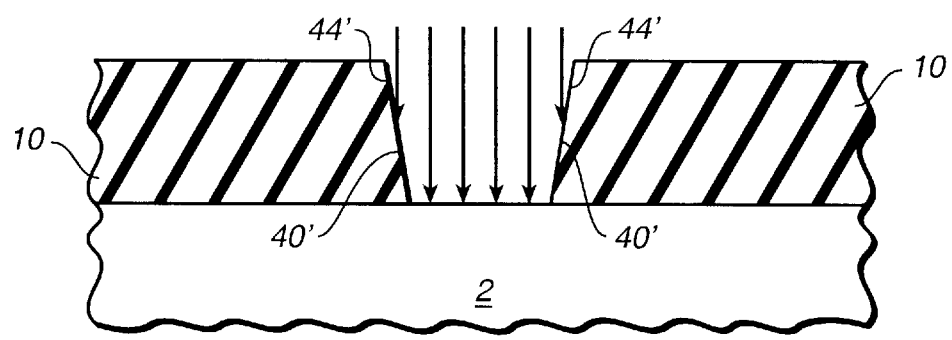
FIG._6

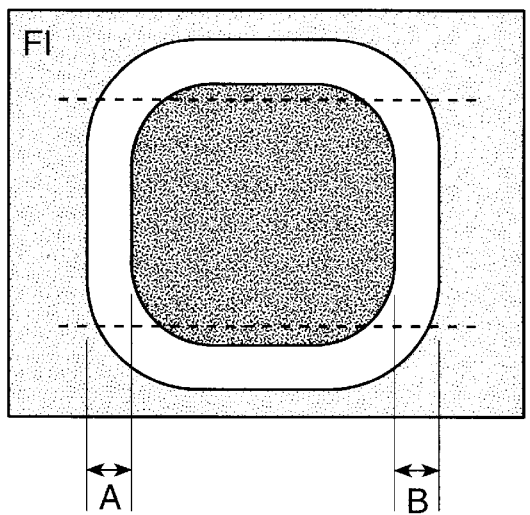
FIG._7
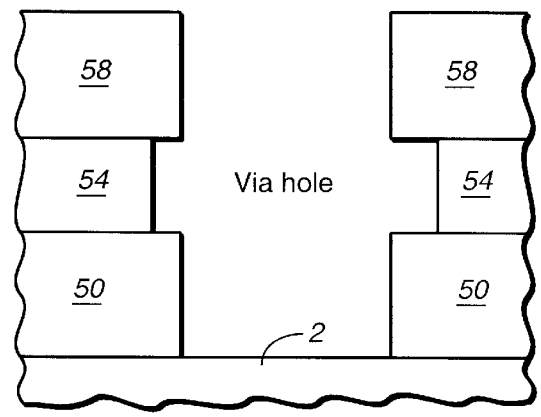
FIG._8
*(PRIOR ART)*
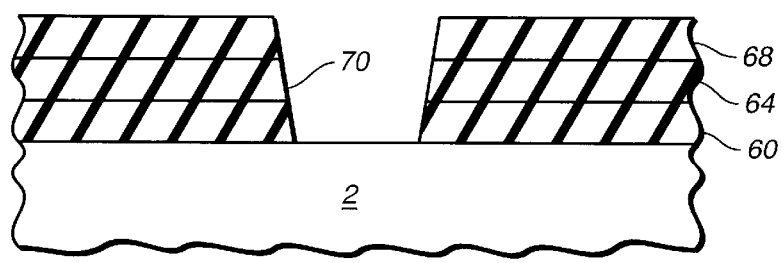
FIG._9

US 6,559,048 B1

METHOD OF MAKING A SLOPED SIDEWALL VIA FOR INTEGRATED CIRCUIT STRUCTURE TO SUPPRESS VIA POISONING

BACKGROUND OF THE INVENTION

1. Field of the Invention

This invention relates to integrated circuit structures. More particularly this invention relates to improvements in the plasma etching of low dielectric constant (low k) carbon-containing silicon oxide dielectric material used in the formation of integrated circuit structures.

2. Description of the Related Art

The shrinking of integrated circuits has resulted in levels of electrically conductive interconnects being placed closer together vertically, as well as reduction of the horizontal spacing between the electrically conductive interconnects, such as metal lines, on any particular level of such interconnects. As a result, capacitance has increased between such conductive portions, resulting in loss of speed and increased cross-talk. One proposed approach to solving this problem of high capacitance is to replace the conventional silicon oxide ($SiO_2$) dielectric material, having a dielectric constant (k) of about 4.0, with another insulation material having a lower dielectric constant to thereby lower the capacitance.

In an article by L. Peters, entitled "Pursuing the Perfect Low-K Dielectric", published in Semiconductor International, Volume 21, No. 10, September 1998, at pages 64–74, a number of alternate dielectric materials are disclosed and discussed. Included in these dielectric materials is a description of a low k dielectric material having a dielectric constant of about 3.0 formed using a Flowfill chemical vapor deposition (CVD) process developed by Trikon Technologies of Newport, Gwent, U.K. The process is said to react methyl silane ($CH_3$—$SiH_3$) with hydrogen peroxide ($H_2O_2$) to form monosilicic acid which condenses on a cool wafer and is converted into an amorphous methyl-doped silicon oxide which is annealed at 400° C. to remove moisture. An article by S. McClatchie et al. entitled "Low Dielectric Constant Oxide Films Deposited Using CVD Techniques", published in the 1998 Proceedings of the Fourth International Dielectrics For ULSI Multilevel Interconnection Conference (Dumic) held on Feb. 16–17, 1998 at Santa Clara, Calif., at pages 311–318, also describes the formation of methyl-doped silicon oxide by the low-k Flowfill process of reacting methyl silane with $H_2O_2$ to achieve a dielectric constant of ~2.9.

The incorporation of such carbon-doped silicon oxide dielectric material into interconnect architecture has been very attractive not only because of the low k properties, but also because of the compatibility with conventional silicon process technologies. Generally these materials remain stable upon annealing at temperatures of up to 500° C. The carbon doped silicon oxide materials are characterized by the structure of amorphous silicon oxide with incorporated methyl groups and hydrogen species, and are also characterized by a reduced density in comparison with conventional silicon oxide that can be explained by the formation of microporosity surrounding the incorporated methyl groups. Furthermore, such hydrocarbon-modified silicon oxide dielectric materials deposited by CVD techniques are also characterized by strong adhesion.

While such carbon-doped silicon oxide dielectric materials do exhibit the desired low k (i.e., dielectric constants below about 3.0), resulting in reduced capacitance of the dielectric material, a major problem of such carbon-doped silicon oxide is a low resistance to oxidation that results in a destruction of the incorporated hydrocarbons and a resulting increase in the overall dielectric constant of the dielectric material. The sensitivity to oxidation is thought to be due to the reactivity of the C—H bonds of the methyl group bonded to silicon. The removal of the methyl group results in a more hydrophilic surface that may be responsible for a so-called "via poisoning" which is observed after via etch and photoresist strip with oxygen-containing plasma, and is believed to be related to suppression of the surface nucleation in subsequent via liner deposition steps, resulting in incomplete or inadequate filling of the via with metal filler.

FIG. 1 and 2 illustrate a typical prior art formation of vias in low k dielectric material. In FIG. 1, a layer 10 of 10'" k dielectric material has been previously formed over a dielectric structure 2. A conventional photoresist mask 14 is shown formed over low k dielectric layer 10 with a straight sidewall via mask opening 16 formed therein. FIG. 2 shows the structure of FIG. 1 after etching of a via opening 12 in low k dielectric layer 10. When resist mask 14 is removed, followed by further cleaning of via 12, and via 12 is then filled with conductive material such as one or more metals and/or one or more conductive metal compounds, the resulting structure is found to frequently (although not always) comprise vias which are inadequately filled with the electrically conducting filler material resulting in a phenomena called "via poisoning". Such via poisoning may be due to damage to the low k dielectric material comprising the sidewalls of the via, resulting in the absorption of moisture into the low k dielectric material which is then released by the damaged low k dielectric material during subsequent processing, including the via filling step. Alternately, or in addition, such via poisoning may be the result of the presence of etch residues remaining in the via as a result of inadequate cleaning of the via after either formation of the via or removal of the resist mask or both.

It has been proposed to treat damaged sidewalls of vias formed in low k carbon-containing silicon oxide dielectric materials with a plasma, either before or after removal of the via resist mask. Sukharev et al. U.S. Pat. No. 6,114,259, issued Sep. 5, 1999, assigned to the assignee of this invention, and the subject matter of which is hereby incorporated by reference, teaches treating exposed surfaces of low k dielectric material such as via sidewalls with a plasma of $O_2$, $N_2$, $H_2$. Ar, Ne, or He prior to damage caused by removal of the resist mask.

Wang et al. U.S. Pat. No. 6,028,015, issued Mar. 29, 1999, assigned to the assignee of this invention, and the subject matter of which is also hereby incorporated by reference, teaches treating previously damaged surfaces of low k dielectric material with a $H_2$ plasma to cause hydrogen atoms to bond with silicon having dangling bonds in the damaged areas.

Catabay et al. U.S. Pat. No. 6,346,490 B1, issued Feb. 12, 2002, assigned to the assignee of this invention, and the subject matter of which is also hereby incorporated by reference, teaches treating previously damaged surfaces of low k dielectric material with a carbon-containing gas before exposure of the damaged surfaces to the atmosphere.

While such treatments are effective in reducing the amount of via poisoning, the amount of such via poisoning can, even after such treatments, still be unacceptably high in some cases. It would, therefore, be desirable to provide for further improvements in the treatment of exposed via surfaces of low k carbon-containing silicon oxide dielectric materials to further reduce the incidence of via poisoning.

SUMMARY OF THE INVENTION

In accordance with the invention, via poisoning of vias formed in low k carbon-containing silicon oxide dielectric material is suppressed by forming the via in a layer of such dielectric material with a smooth inwardly sloped sidewall. Such a sloped sidewall via can be etched in a low k dielectric layer by first forming a via resist mask over the upper surface of such a dielectric layer, then heat treating the mask sufficiently to deform the sidewall geometry of the resist mask to form a sloped or rounded sidewall on the opening or openings in the heat treated resist mask. The resulting erosion of such a resist mask, during a subsequent etch step to form the via in the low k dielectric material through such a sloped sidewall resist mask, imparts a tapered or sloped sidewall geometry to the via which is then formed in the underlying layer of low k dielectric material.

In a preferred embodiment, when the via is cut through several layers of different types of dielectric material, the smoothness of the sloped sidewall of the resulting via is enhanced by adjusting the selectivity of the via etch to uniformly etch each of the layers of dielectric material at approximately the same rate.

BRIEF DESCRIPTION OF THE DRAWINGS

FIG. 1 is a fragmentary vertical side-section view of a prior art integrated circuit structure with a conventional prior art photoresist mask having straight sidewalls shown formed over a low k dielectric layer before etching of a via in the low k dielectric layer through the opening in the photoresist mask.

FIG. 2 is a fragmentary vertical side-section view of the prior art structure of FIG. 1 with a straight-sidewall via shown etched in the low k dielectric layer through the straight-sidewall opening in the prior art photoresist mask.

FIG. 3 is a fragmentary vertical side-section view of the prior art structure of FIG. 1 after heat treatment of the photoresist mask in accordance with the invention to form a resist mask with sloped sidewall openings.

FIG. 4 is a fragmentary vertical side-section view of the structure of FIG. 3 after partial etching of a tapered via in the low k dielectric material through the heat treated resist mask with sloped sidewall openings.

FIG. 5 is a fragmentary vertical side-section view of the structure of FIG. 3 after completion of the etching of a tapered via in the low k dielectric material through the heat treated resist mask with sloped sidewall openings.

FIG. 6 is a fragmentary vertical side-section view of the structure of FIG. 5 after removal of the heat treated resist mask with sloped sidewall openings, with the sloped or tapered sidewall via ready for filling with one or more metals and/or one or more electrically conductive metal compounds.

FIG. 7 is a top-down scanning electron microscope (SEM) view of the slanted sidewall via showing, in white, the difference in diameter between the small bottom opening of the slanted sidewall via and the large opening of the slanted sidewall via at the top.

FIG. 8 is a fragmentary vertical side-section view of a prior art integrated circuit structure with multiple layers of different dielectric materials wherein at least one of the multiple layers of dielectric materials is a layer of low k dielectric material, showing a via cut through the multiple layers of different dielectric materials and illustrating, in exaggerated form, the resulting uneven via sidewall edges when the various layers of different dielectric materials do not etch at the same rate.

FIG. 9 is a fragmentary vertical side-section view of an integrated circuit structure with multiple layers of different dielectric materials showing the formation of a smoothly tapered or sloped sidewall via formed therein in accordance with the invention, using a heat treated photoresist mask with sloped sidewall openings and an etch system which uniformly etches all of the layers of different dielectric materials.

DETAILED DESCRIPTION OF THE INVENTION

In accordance with the invention, via poisoning of vias formed in low k carbon-containing silicon oxide dielectric material is suppressed by forming the via in a layer of such dielectric material with a smooth inwardly sloped sidewall. Such a sloped sidewall via can be etched in a low k dielectric layer by first forming a via resist mask over the upper surface of such a dielectric layer, then heat treating the mask sufficiently to deform the sidewall geometry of the resist mask to form a sloped sidewall on the opening or openings in the heat treated resist mask. The resulting erosion of such a resist mask, during a subsequent etch step to form the via in the low k dielectric material through such a sloped sidewall resist mask, imparts a tapered or sloped sidewall geometry to the via which is then formed in the underlying layer of low k dielectric material.

By use of the term "inwardly sloped sidewall", with respect to the description of the via formed in the dielectric layer beneath the heat treated resist mask, is meant a via sidewall surface which is sloped to provide a larger diameter in the via adjacent the resist mask and a smaller via diameter at the bottom or opposite end of the via.

By use of the term "low k dielectric material" is meant a dielectric material having a dielectric constant below about 4, preferably below about 3.5, and most preferably below 3.0. Such dielectric material may comprise, by way of example, a carbon-containing silicon oxide formed by the reaction of a carbon-containing source of silicon with an oxidizing agent.

Examples of such carbon-containing sources of silicon include the methyl-containing silanes described in the previously discussed Peters and McClatchie et al. articles and the carbon-containing silicon precursors described in U.S. Pat. No. 6,303,047, issued Oct. 16, 2001, assigned to the assignee of this invention, and the subject matter of which is hereby incorporated by reference.

Examples of oxidizing agents which may be reacted with such carbon-containing silicon precursors to form low k carbon-containing silicon oxide dielectric materials include, by way of example, $O_2$, $O_3$, NO, $NO_2$, $N_2O$, $H_2O_2$, and mixtures of same.

The desired sloped sidewall via of the invention is made by first forming, over the upper surface of the layer of low k dielectric material in which the desired sloped sidewall via is to be formed, a via resist mask having one or more openings therein. It should be noted that the resist mask need not be formed directly over the layer of low k dielectric material. Typically, the layer of low k dielectric material will be formed with a thin (e.g., 300–1000 Angstroms) protective capping layer of conventional dielectric constant dielectric material formed over the layer of low k dielectric material to protect the otherwise exposed upper surface of the low k dielectric layer. The resist mask, at this point, will resemble the prior art resist mask 14 with straight sidewalls.

In accordance with the invention, the resist mask is then heat treated sufficiently to deform the sidewall geometry of the resist mask to form a sloped sidewall on each of the one or more openings in the resist mask. This is shown in FIG. 3 where a heat treated resist mask 20 is shown with an opening 26 therein having sloped sidewalls 30.

Heat treated resist mask 20 is formed by heat treating a photolithographically processed organic photoresist mask layer on a dielectric layer at a minimum time and temperature sufficient to cause enough flow of the resist material to cause the upper corner of the openings already formed therein to be sloped. Temperatures higher that such a minimum temperature may be used, provided however, that the heat treatment temperature must be maintained below a temperature which would burn and/or destroy the resist material or destroy the integrity of the resist material as a mask. Preferably the resist mask is heat treated at a temperature ranging from about 100° C. to about 300° C., and most preferably at a temperature ranging from about 150° C. to about 250° C., with the heat treatment typically carried out at a temperature of about 170° C. The heat treatment of the resist mask is preferably carried out for a time period ranging from about 30 second to about 5 minutes, and typically for about 2 minutes.

After formation of the heat treated resist mask, as seen in FIG. 3, etching of the underling layer of dielectric material is commenced, using an etchant system selective to the material, such as another metal layer, lying below the dielectric layer to be etched. It should be noted here that the etchant system selected should also be selective to the resist mask material, i.e., the etchant system should etch the dielectric material below the mask at a faster rate than the resist material is etched. However, the amount of selectivity of the etchant system to the resist material should not be so great so as to completely suppress the etching of any resist material since the formation of the sloped surface via in the dielectric material depends on some degree of erosion of the sloped surfaces of the opening in the resist mask during the etching step.

This is illustrated in FIGS. 4 and 5, which respectively shown the etch step partially done and completely done. It will be noted, by a comparison of FIG. 3 with FIG. 4, that the original sloped sidewalls of opening 30 in mask 20 of FIG. 3 have been partially etched to become sloped sidewalls 30' of resist mask 20' in FIG. 4, and that this erosion results in the replication of such non-straight etch mask sidewalls of mask 20 in dielectric layer 10 by the slanted sidewalls 44 of via 40 being etched in dielectric layer 10. It will also be noted, however, that the via mask opening 26 at the bottom of resist layer 30 of FIG. 3 is replicated in the width of opening 26' at the bottom of the partially formed via 40 in FIG. 4. This is because the sloped sidewalls 44 of via 40 being formed during the via etch act as self-alignment masks during the etch.

FIG. 5 illustrates the completion of the formation, in dielectric layer 10, of via 40' with slanted sidewalls 44' through now further eroded resist mask 20" with further eroded sloped sidewalls 30" thereon. The structure of FIG. 5 is now ready for further processing to remove etch residues and for removal of the remaining portions of resist mask 20". Removal of etch residues from vias and/or removal of via etch masks are described, for example, in U.S. Pat. No. 6,114,259; and U.S. Pat. Nos. 6,204,192, 6,346,490 B1, and 6,316,354; all assigned to the assignee of this patent application; and the subject matter of each of which is hereby incorporated into this application by reference. FIG. 6 shows via 40' with slanted sidewalls 44' after removal of resist mask 20" of FIG. 5, and after cleaning of via 40' to remove etch residues.

FIG. 6 shows via 40' with slanted sidewalls 44' after removal of resist mask 20" of FIG. 5, and after cleaning of via 40' to remove etch residues.

The slanted sidewall via 40' shown in FIG. 6 is now ready for conventional filling with one or more metals and/or one or more electrically conductive metal compounds. Such filling, for example when tungsten is the main filler metal, may comprise deposition of a thin layer of titanium over the via sidewall surfaces to facilitate bonding, i,e, as the so-called "glue layer", followed by deposition of a thin layer of titanium nitride as a barrier layer, with tungsten then deposited over the barrier layer to fill up the via. Alternatively, for example when copper is the main filler metal, a thin layer of tantalum may be first deposited over the via sidewall surfaces as the so-called "glue layer", followed by deposition of a thin layer of tantalum nitride as a barrier layer, with copper then deposited over the barrier layer to fill up the via.

When such depositions are carried out to fill the slanted sidewall vias formed in accordance with the above-described process of the invention it will be found that the incidence of via poisoning will be markedly reduced, if not eliminated. While we do not wish to be bound by any particular theories as to why the slanted sidewall vias of the invention appear to eliminate via poisoning, it is believed that the slanted sidewalls of such a via facilitate cleaning of the via to remove undesired foreign materials such as etch residues (from either formation of the via or removal of the via resist mask), and also may result in densification of the surface of the slanted sidewalls of the via by impaction of the anisotropic cleaning beam with such slanted surfaces, as shown in FIG. 6. Such impaction would not be as likely to occur between an anisotropic cleaning beam and a straight-walled via. The slanted sidewalls of the invention are also believed to enhance wet cleaning of the via by making it easier to remove solvents and impurities from the via.

If it is deemed necessary or desirable to determine the angle of the slanted sidewalls of the via, this can be calculated using the thickness of the dielectric material through which the via is formed, and the difference between the diameter of the sloped via at the bottom of the via and the diameter of the via at the top of the via. This difference between the bottom and top diameters of the sloped via may be determined, for example, using a top-down scanning electron microscope (SEM), as shown in FIG. 7, wherein the sloped sidewalls of the via are shown as the light regions. The thickness of the white regions representing the difference between the respective diameters at the bottom and top of the via may then be measured, as shown at A and B in FIG. 7.

When the dielectric material through which the via is to be etched actually comprises a compound layer composed of several layers of dielectric material, the respective etch rates of each of the layers of dielectric material may differ somewhat. Prior art FIG. 8 illustrates the problem in exaggerated form when a prior art straight sidewall via is etched through, for example, a compound dielectric layer which actually comprises, as shown in FIG. 8, three dielectric layers such as, for example, a thin barrier layer 50 of conventional silicon oxide dielectric material over a lower portion of an integrated circuit structure 2 a main layer 54 of low k carbon-containing silicon oxide dielectric material, and a thin upper capping layer 58 of conventional silicon oxide dielectric material. While the respective thicknesses of each of the three layers has been made equal for illustrative purposes only, it will be readily apparent that unequal etch rates of the respective layers can result in the formation of a via with rough sidewall surfaces, making it difficult to completely remove the undesirable etch residues therefrom.

In a preferred embodiment of the invention, when the slanted sidewall via of the invention is cut through several such layers of dielectric material, the smoothness of the sidewall of the via is enhanced by adjusting the selectivity of the via etch to uniformly etch each of such layers of varying dielectric material at approximately the same rate. The result will be as shown in FIG. 9, which illustrates the result of the practice of both aspects of the invention, with a smooth sidewall via 70 shown etched in different dielectric layers 60, 64, and 68 using an etchant system optimized to etch the three layers of different types of dielectric materials at the same etch rate.

As an example of the practice of the invention on a compound layer of differing dielectric materials, as shown in FIG. 9, the heat treated resist mask of the invention was first formed over a compound dielectric layer on a substrate 2 comprising 200 Angstroms of a conventional silicon oxide barrier layer 60, a low k layer 64 comprising 750 nanometers (nm) of carbon-containing silicon oxide dielectric material formed over the barrier layer 60 by depositing the reaction product of methyl silane and hydrogen peroxide, with a protective capping layer 68 comprising 500 Angstroms of conventional silicon oxide formed over layer 64 of low k dielectric material.

The etch process typically consists of two steps, a main etch and an over etch. For the etch steps, the coated substrate was placed in a 21 liter etching chamber maintained at a temperature of about 20° C. and a pressure of about 140 millitorr. For the main etching step, into the etching chamber was flowed an etchant mixture of gases comprising 4.5 standard cubic centimeters per minute (sccm) of $C_4F_8$, 90 sccm of CO, 90 sccm of $N_2$, and 200 sccm of Ar. A plasma was ignited in the etching chamber and maintained at a power level of 1500 watts during the two etch steps. After about 70 seconds to complete the first etch step, the flow of gases was changed to 4.5 sccm of $C_4F_8$, 120 sccm of CO, 90 sccm of $N_2$, and 170 sccm of Ar for the second etch step or "over etch". After an additional etch time of about 70 seconds, the plasma was extinguished and the substrate, after cooling, was removed from the etching chamber. After removal of etch resides by conventional cleaning, the via surfaces were examined by TEM (Transmissiion Electron Microscope). Examination of the sidewall surfaces of the via revealed a smooth slanted sidewall surface in the via despite the formation of the via through three layers of different dielectric material.

Thus, the invention provides a novel modification of a via mask to alter the mask openings so that vias with smooth slanted sidewalls can be formed in one or more underlying layers of dielectric materials, thereby facilitating cleaning of the via to remove etch residues, as well as optionally densifying the etched sidewalls of the via with the cleaning beam, resulting in the suppression of via poisoning during subsequent filling of the vias with one or more metals and/or other electrically conductive filler materials.

Having thus described the invention what is claimed is:

1. A process for forming vias in one or more layers of dielectric material, including at least one layer of low k carbon-containing silicon oxide dielectric material comprising the reaction product of methyl silane and hydrogen peroxide, on an integrated circuit structure which suppresses subsequent via poisoning which comprises:
   a) first forming a via resist mask with one or more openings over the upper surface of said layer of low k dielectric material;
   b) then heat treating said resist mask sufficiently to deform the sidewall geometry of the resist mask to form a sloped sidewall on said one or more openings in said heat treated resist mask;
   c) then etching said layer of low k dielectric material through said one or more openings in said heat treated resist mask to form one or more vias in said layer of low k dielectric material with a smooth inwardly sloped sidewall;

whereby the resulting erosion of such a resist mask, during said subsequent etch step to form said one or more vias in said layer of low k dielectric material through said heat treated resist mask, imparts a tapered or sloped sidewall geometry to said one or more vias formed in said layer of low k dielectric material to thereby suppress via poisoning during subsequent filling of said one or more vias.

2. The process of claim 1 wherein said step of heat treating said resist mask sufficiently to deform said sidewall geometry of said resist mask to form said sloped sidewall on said one or more openings in said heat treated resist mask further comprises heating said resist mask to a temperature sufficient to cause enough flow of the resist material to cause the upper corner of said one or more openings already formed therein to slope without, however, changing the diameter of said one or more mask openings at the lower surface of said resist mask on said one or more layers of dielectric material to be etched through said resist mask.

3. The process of claim 1 wherein said step of heat treating said resist mask sufficiently to deform said sidewall geometry of said resist mask to form said sloped sidewall on said one or more openings in said heat treated resist mask further comprises heat treating said resist mask for a time period ranging from about 30 second to about 5 minutes.

4. The process of claim 3 wherein said step of heat treating said resist mask sufficiently to deform said sidewall geometry of said resist mask to form said sloped sidewall on said one or more openings in said heat treated resist mask further comprises heat treating said resist mask at a temperature ranging from about 100° C. to about 300° C.

5. The process of claim 3 wherein said step of heat treating said resist mask sufficiently to deform said sidewall geometry of said resist mask to form said sloped sidewall on said one or more openings in said heat treated resist mask further comprises heating said resist mask to a temperature ranging from about 150° C. to about 250° C.

6. The process of claim 1 wherein said one or more layers of dielectric material, including at least one layer of low k dielectric material, further comprises a barrier layer of silicon oxide dielectric material over said integrated circuit structure and beneath said layer of low k dielectric material.

7. The process of claim 1 wherein said one or more layers of dielectric material, including at least one layer of low k dielectric material, further comprises a capping layer of silicon oxide dielectric material over said layer of low k dielectric material.

8. The process of claim 1 wherein said one or more layers of dielectric material, including at least one layer of low k dielectric material, further comprise;
   a) a barrier layer of silicon oxide dielectric material over said integrated circuit structure and beneath said layer of low k dielectric material; and b) a capping layer of silicon oxide dielectric material over said layer of low k dielectric material.

9. The process of claim 8 wherein said step of etching said layer of low k dielectric material through said one or more openings in said heat treated resist mask to form one or more vias in said layer of low k dielectric material with a smooth inwardly sloped sidewall further comprises etching said capping layer of silicon oxide, said layer of low k dielectric material, and said barrier layer through said one or more openings in said heat treated resist mask using an etchant system which is capable of etching said capping layer, said low k layer, and said barrier layer at the same etch rate whereby the resulting via etched through the three layers will have a smooth inwardly sloped sidewall.

10. A process for forming one or more vias in a plurality of layers of dielectric material, including at least one layer of low k carbon-containing silicon oxide dielectric material comprising the reaction product of methyl silane and hydrogen peroxide, on an integrated circuit structure which suppresses subsequent via poisoning which comprises:

a) forming a first layer of dielectric material over said integrated circuit structure;

b) forming a layer of low k dielectric material over said first layer of dielectric material;

c) forming a third layer of dielectric material over said layer of low k dielectric material;

d) forming a via resist mask with one or more openings over the upper surface of said third layer of dielectric material;

e) then heat creating said resist mask sufficiently to deform the sidewall geometry of said resist mask to form a sloped sidewall on said one or more openings in said heat treated resist mask;

f) then etching said third layer of dielectric material, said layer of low k dielectric material, and said first layer of dielectric material through said one or more openings in said heat treated resist mask with an etchant system capable of etching said third layer of dielectric material, said layer of low k dielectric material, and said first layer of dielectric material at substantially the same etch rate to form one or more vias in said third layer, said low k layer, and said first layer of dielectric material characterized by a smooth inwardly sloped sidewall;

whereby subsequent cleaning of said one or more vias having said inwardly tapered sidewalls, followed by filling of said one or more vias with one or more electrically conductive materials, will result in the formation of one or more filled vias free of via poisoning.

11. A via having inwardly sloped sidewalls and formed in one or more layers of dielectric material, including at least one layer of low k carbon-containing silicon oxide dielectric material comprising the reaction product of methyl silane and hydrogen peroxide, on an integrated circuit structure and further characterized by a capability of suppressing via poisoning, and formed by a) first forming a via resist mask with one or more openings over the upper surface of said one or more layers of dielectric material;

b) then heat treating said resist mask sufficiently to deform the sidewall geometry of the resist mask to form a sloped sidewall on said one or more openings in said heat treated resist mask;

c) then etching said one or more layers of dielectric material through said one or more openings in said heat treated resist mask to form one or more vias in said one or more layers of dielectric material with a smooth inwardly sloped sidewall;

whereby the resulting erosion of such a resist mask, during said subsequent etch step to form said one or more vias in said one or more layers of dielectric material through said heat treated resist mask, imparts a tapered or sloped sidewall geometry to said one or more vias formed in said one or more layers of dielectric material to thereby suppress via poisoning during subsequent filling of said one or more vias.

12. A process for forming vias in one or more layers of dielectric material, including at least one layer of low k carbon-containing silicon oxide dielectric material comprising the reaction product of hydrogen peroxide with a multiple carbon-substituted silane having only primary hydrogens bonded to the carbon atoms and having the formula $SiH_x((C)_y(CH_3)_z)_{(4-x)}$, where x ranges from 1 to 3, y is an integer from 1 to 4 for a branched alkyl group and from 3 to 5 for a cyclic alkyl group and z is 2y+1 for a branched alkyl group and 2y−1 for a cyclic alkyl group, on an integrated circuit structure which suppresses subsequent via poisoning which comprises:

a) first forming a via resist mask with one or more openings over the upper surface of said layer of low k dielectric material;

b) then heat treating said resist mask sufficiently to deform the sidewall geometry of the resist mask to form a sloped sidewall on said one or more openings in said heat treated resist mask;

c) then etching said layer of low k dielectric material through said one or more openings in said heat treated resist mask to form one or more vias in said layer of low k dielectric material with a smooth inwardly sloped sidewall;

whereby the resulting erosion of such a resist mask, during said subsequent etch step to form said one or more vias in said layer of low k dielectric material through said heat treated resist mask, imparts a tapered or sloped sidewall geometry to said one or more vias formed in said layer of low k dielectric material to thereby suppress via poisoning during subsequent filling of said one or more vias.

13. A via having inwardly sloped sidewalls and formed in one or more layers of dielectric material, including at least one layer of low k carbon-containing silicon oxide dielectric material comprising the reaction product of hydrogen peroxide with a multiple carbon-substituted silane having only primary hydrogens bonded to the carbon atoms and having the formula $SiH_x((C)_y(CH_3)_z)_{(4-x)}$, where x ranges from 1 to 3, y is an integer from 1 to 4 for a branched alkyl group and from 3 to 5 for a cyclic alkyl group and z is 2y+1 for a branched alkyl group and 2y−1 for a cyclic alkyl group, on an integrated circuit structure, and further characterized by a capability of suppressing via poisoning, and formed by:

a) first forming a via resist mask with one or more openings over the upper surface of said one or more layers of dielectric material;

b) then heat treating said resist mask sufficiently to deform the sidewall geometry of the resist mask to form a sloped sidewall on said one or more openings in said heat treated resist mask;

c) then etching said one or more layers of dielectric material through said one or more openings in said heat treated resist mask to form one or more vias in said one or more layers of dielectric material with a smooth inwardly sloped sidewall;

whereby the resulting erosion of such a resist mask, during said subsequent etch step to form said one or more vias in said one or more layers of dielectric material through said heat treated resist mask, imparts a tapered or sloped sidewall geometry to said one or more vias formed in said one or more layers of dielectric material to thereby suppress via poisoning during subsequent filling of said one or more vias.

* * * * *